United States Patent [19]

Fritz et al.

[11] Patent Number: 5,118,991
[45] Date of Patent: Jun. 2, 1992

[54] ELECTRON BEAM GENERATOR FOR AN ELECTRON GUN

[75] Inventors: Dieter Fritz, Gelnhausen; Wolfgang Schwarz, Linsengericht, both of Fed. Rep. of Germany

[73] Assignee: PTR Präzisionstechnik GmbH, Maintal/Dörnigheim, Fed. Rep. of Germany

[21] Appl. No.: 579,792

[22] Filed: Sep. 10, 1990

[30] Foreign Application Priority Data

Sep. 9, 1989 [DE] Fed. Rep. of Germany ....... 3930200

[51] Int. Cl.⁵ .......................................... H05B 39/00
[52] U.S. Cl. ..................................... 315/94; 315/245; 328/8
[58] Field of Search ............... 315/94, 98, 105, 106, 315/111.81, 245; 313/313, 326, 336, 341; 250/306, 307, 310, 311; 361/118, 126; 328/8, 10

[56] References Cited

U.S. PATENT DOCUMENTS

| 3,534,223 | 10/1970 | Murphy | 315/94 |
| 3,868,541 | 2/1975 | Vanzvijlen | 315/94 |
| 3,887,835 | 6/1975 | Nomura | 315/94 |
| 3,895,254 | 7/1975 | Minamikawa | 315/94 |
| 3,931,517 | 1/1976 | Coates | 313/336 |
| 4,427,886 | 1/1984 | Martin | 250/310 |

Primary Examiner—Eugene R. Laroche
Assistant Examiner—A. Zarabian
Attorney, Agent, or Firm—Felfe & Lynch

[57] ABSTRACT

In an electron beam generator where the heating current for the cathode is transformed by an insulating transformer 7 disposed on the high-voltage insulator 4 of the beam head, the primary winding of this insulating transformer 7 being connected to ground potential, and where a single-pole high-voltage connection 2 and a single-pole high-voltage cable 2 connect the beam head 3 to a high-voltage generator 1, the high-voltage cable 2, at its terminal ends, has a protective resistor 10 corresponding to the surge impedance of the high-voltage cable 2 in order to reduce the damages to insulating and component parts.

1 Claim, 1 Drawing Sheet

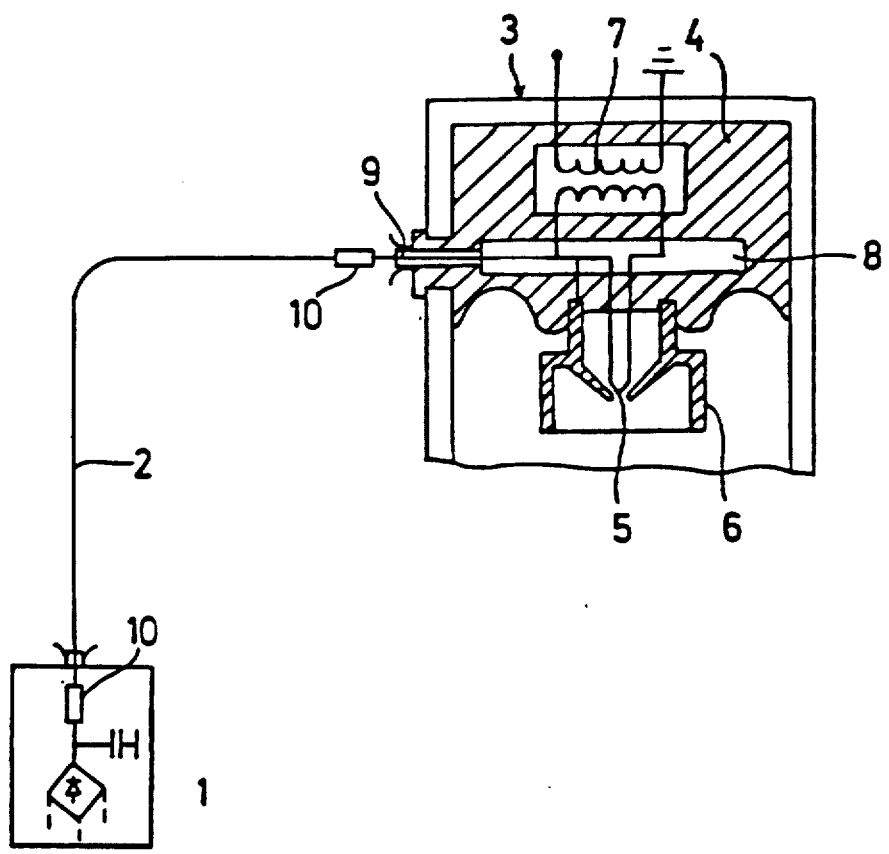

ELECTRON BEAM GENERATOR FOR AN ELECTRON GUN

BACKGROUND OF THE INVENTION

The invention relates to an electron beam generator, particularly for an electron gun comprising a hot cathode and a control cathode which is disposed at a high-voltage insulator and can be connected to a high-voltage generator by means of a single-pole high-voltage cable. On top of the high-voltage insulator, there is disposed an insulating transformer for converting the cathode heating current. The primary winding of this transformer is connected to ground potential.

An electron beam generator of this kind for an electron gun for heating materials, particularly for welding, is known from DE-OS 33 686, to which U.S. Pat. No. 4,574,178 corresponds. Since the beam head is combined with a complete auxiliary voltage transmission by construction, a multi-pole cable with corresponding plug connections is no longer required for this known electron gun. Particularly the ohmic line losses which are caused by the heating current are reduced to almost zero. Since these losses are eliminated, the power to be transmitted is significantly reduced and the volume of the insulating transformers is no longer determined by the power to be transmitted but only by the necessary insulating distances. The power supply of the insulating transformers is at ground potential, and the control voltages are supplied via multiple plugs on the low-voltage potential of the beam head. Due to the much better capacitive coupling between the individual potentials, failures of components of the auxiliary voltage generator caused by arcovers and excess voltages connected therewith are already substantially reduced in the known electron gun. But there is still need to increase the operational reliability of the remaining electronic equipment od such electron beam apparatus.

SUMMARY OF THE INVENTION

It is hence an object of the invention to increase the operational reliability of an electron beam generator of the aforesaid kind and to reduce failures of components caused by excess voltages in the electronic equipment of the apparatus and the high-voltage generator.

The object is accomplished in that at its terminal ends, the single-pole high-voltage cable connected to the high-voltage terminal has protective resistors the impedance of which corresponds to or is matched with the surge impedance of the high-voltage cable.

In case there are high-voltage arcovers in the electron beam generator, the arrangement of protective resistors in accordance with the invention prevents reflections and travelling surges and, hence, substantially reduces disturbances in the high-voltage generator. Damages to insulating and component parts in the high-voltage generator and in the entire electrical equipment of the electron beam unit are consequently substantially reduced and the operational reliability of the system is essentially improved. Further, the invention permits the use of long high-voltage cables without impairing the operational reliability of the system.

In accordance with the invention, provision is also made for the protective resistor to have a higher ohmic resistance. Due to the stored capacitive energy, the flashover current is thus limited in the high-voltage cable, and the electrodes in the acceleration chamber are correspondingly protected against damage.

BRIEF DESCRIPTION OF THE DRAWING

The sole Figure is a schematic of an electron beam generator with the high voltage generator.

DETAILED DESCRIPTION OF THE PREFERRED EMBODIMENT

The drawing shows the high voltage generator 1 which is connected to the beam head 3 of an electron beam generator via a single-pole high voltage cable 2. The beam head 3 contains a high-voltage insulator 4 carrying a cathode 5 and a control electrode 6. In the high-voltage insulator 4, there is an insulating transformer 7 with the primary winding connected to ground, potential. It serves as a current transformer for the cathode current. Further, a casing 8 in the high-voltage insulator 4 accommodates switching elements for the control of the electron beam generator. A high-voltage connection 9 connects these elements to the high-voltage cable 2. A protective resistor 10 is provided at the end of the cable connected to the high-voltage generator 1 and at the terminal end of the high-voltage cable 2 connected to the beam head 3. The impedance of each protective resistor 10 matches the surge impedance of the high-voltage cable 2.

We claim:
1. Electron beam generator comprising
   a high voltage insulator,
   a hot cathode on said high voltage insulator,
   a control cathode on said high voltage insulator,
   an insulating transformer disposed in said high voltage insulator for transformation of cathode heating current, said transformer having a primary winding connected to ground potential,
   a high voltage generator, and
   a single pole high voltage cable having one end connected to said control cathode and an opposite end connected to said high voltage generator, said cable having a protective resistor at each end, the impedance of each resistor at least substantially matching the surge impedance of the high voltage cable.

* * * * *

UNITED STATES PATENT AND TRADEMARK OFFICE
CERTIFICATE OF CORRECTION

PATENT NO. : 5,118,991
DATED : June 2, 1992
INVENTOR(S) : Dieter Fritz et al.

It is certified that error appears in the above-identified patent and that said Letters Patent is hereby corrected as shown below:

Column 1, line 17, delete "DE-OS 33 686" and insert
     -- DE-OS 33 33 686 --.

Signed and Sealed this

Twelfth Day of October, 1993

Attest:

BRUCE LEHMAN

Attesting Officer    Commissioner of Patents and Trademarks